(12) United States Patent
Oh (10) Patent No.: US 6,806,437 B2
(45) Date of Patent: Oct. 19, 2004

(54) INDUCTIVELY COUPLED PLASMA GENERATING APPARATUS INCORPORATING DOUBLE-LAYERED COIL ANTENNA

(75) Inventor: Jae-joon Oh, Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/449,777

(22) Filed: Jun. 2, 2003

(65) Prior Publication Data
US 2004/0040939 A1 Mar. 4, 2004

(30) Foreign Application Priority Data
Sep. 4, 2002 (KR) ........................................ 2002-53162

(51) Int. Cl.[7] ............................................ B23K 10/00
(52) U.S. Cl. ............................ 219/121.43; 219/121.4
(58) Field of Search .................... 219/121.43, 121.4; 156/348.48; 118/723 I, 723 IR, 723 R, 623; 204/298.06, 298.34; 315/111.41, 111.21

(56) References Cited

U.S. PATENT DOCUMENTS

| | | | |
|---|---|---|---|
| 5,401,350 A | | 3/1995 | Patrick et al. |
| 6,080,271 A | | 6/2000 | Fujii |
| 6,120,661 A | * | 9/2000 | Hirano et al. .......... 204/298.15 |
| 6,291,793 B1 | | 9/2001 | Qian et al. |
| 6,297,595 B1 | * | 10/2001 | Stimson et al. ......... 315/111.51 |
| 6,436,304 B1 | * | 8/2002 | Nogami ....................... 216/79 |
| 6,463,875 B1 | * | 10/2002 | Chen et al. ............... 118/723 I |

* cited by examiner

Primary Examiner—Quang T Van
(74) Attorney, Agent, or Firm—Sughrue Mion, PLLC

(57) ABSTRACT

An inductively coupled plasma (ICP) generating apparatus is provided. The apparatus includes an evacuated reaction chamber; an antenna system installed at an upper portion of the reaction chamber to induce an electric field for ionizing reaction gas supplied into the reaction chamber and generating plasma; and an RF power source connected to the antenna system to supply RF power to the antenna system. The antenna system includes a lower antenna installed adjacent to the upper portion of the reaction chamber, and an upper antenna installed a predetermined distance above the lower antenna. Further, the lower and the upper antennas respectively include an outside antenna placed to correspond to edge portions of a substrate within the reaction chamber, and an inside antenna placed inside the outside antenna with a predetermined space therebetween. In the ICP generating apparatus, uniformity of plasma density around a substrate within the reaction chamber can be controlled by adjusting the positions of the upper or the inside antenna.

21 Claims, 9 Drawing Sheets

FIG. 9 case 1          case 2

INDUCTIVELY COUPLED PLASMA GENERATING APPARATUS INCORPORATING DOUBLE-LAYERED COIL ANTENNA

This application claims the priority of Korean Patent Application No. 2002-53162, filed on Sep. 4, 2002, in the Korean Intellectual Property Office, the disclosure of which is incorporated herein in its entirety by reference.

BACKGROUND OF THE INVENTION

1. Field of the Invention

The present invention relates to an apparatus for generating inductively coupled plasma (ICP), and more particularly, to an ICP generating apparatus incorporating a double-layered coil antenna to improve uniformity of plasma density around a substrate within a reaction chamber.

2. Description of the Related Art

Low voltage and low temperature plasma technology is used in the manufacture of semiconductor devices and flat display panels. Plasma is used for etching or depositing certain materials on the surfaces of wafers for fabricating semiconductor devices, or substrates for fabricating liquid crystal display (LCD) panels. Particularly, in etching or thin film deposition processes for manufacturing highly integrated semiconductor devices, the use of plasma equipment is increasing. Therefore, development of plasma generating apparatuses appropriate for etching, deposition, or other processes is important for the development of semiconductor manufacturing processes and equipment. The most important factors in the development of plasma equipment for semiconductor manufacturing processes are the capability to operate on large substrates in order to enhance production yield, and capability to perform processes for fabricating highly integrated devices. Specifically, in accordance with a recent increase in wafer size from 200 mm to 300 mm, enhancing uniformity of wafer treatment processes as well as keeping high plasma density have become very important.

Various types of plasma equipment have been used in conventional semiconductor manufacturing processes, e.g., a capacitive coupled plasma (CCP) type, an electron cyclotron resonance (ECR) type, a helicon type, an inductively coupled plasma (ICP) type, and a hybrid type combining two or more of the foregoing types. Among the various types of plasma equipment, the ICP type equipment is considered to be the best equipment for the 300 mm large-size wafers because the ICP equipment can generate plasma with high density and high uniformity and has a simple structure compared to the other types of plasma equipment. However, development of ICP equipment for 300 mm wafers is not easily achieved by simply changing the dimensions of existing ICP equipment for 200 mm wafers. There are plenty of limitations due to difficulties in designing antennas that are essential to ICP discharges.

Figure 1:
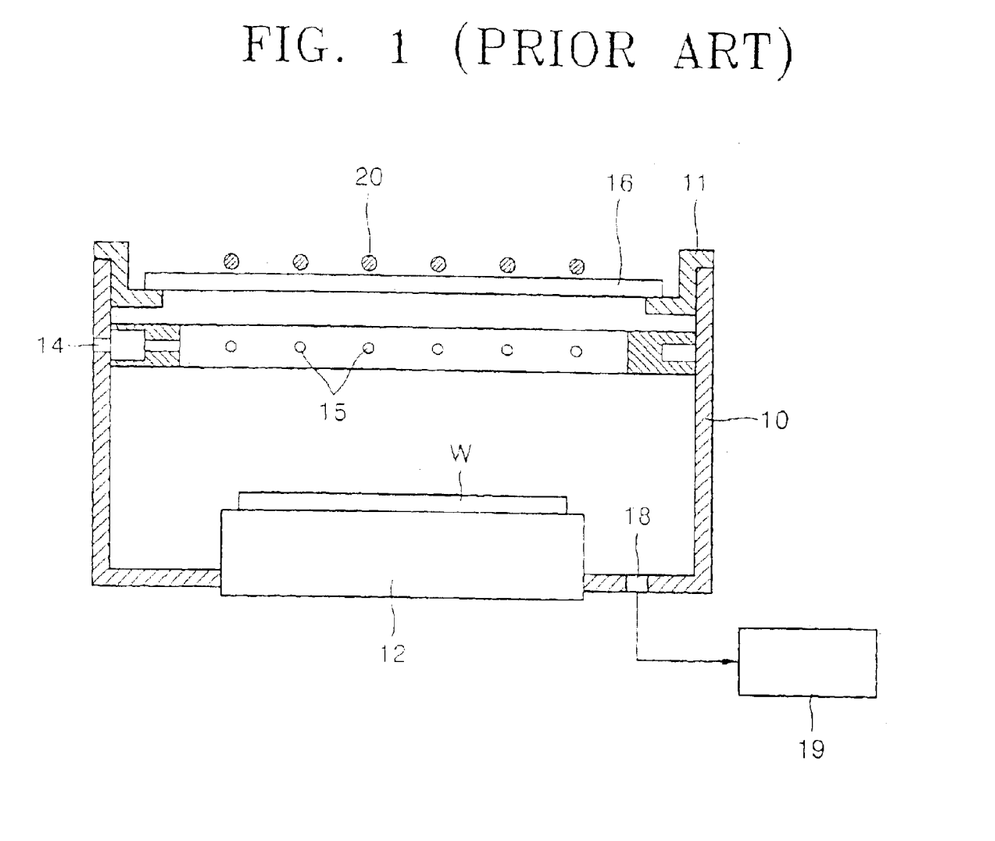
FIG. 1 shows the structure of a conventional inductively coupled plasma (ICP) generating apparatus.

FIG. 1 shows the structure of a conventional ICP generating apparatus. As shown in FIG. 1, the ICP generating apparatus includes a reaction chamber 10 including a space for generating plasma. An electrostatic chuck 12 for supporting a substrate, e.g., a wafer, is provided at a lower portion Within the reaction chamber 10, and a dielectric window 16 is formed in an upper cover 11 of the reaction chamber 10. A gas supply port 14 for supplying reaction gas into the reaction chamber 10 is formed at a sidewall of the reaction chamber 10, and a plurality of gas distribution ports 15 connected to the gas supply port 14 are provided within the reaction chamber 10. A vacuum suction port 18 is formed at the bottom of the reaction chamber 10 and connected to a vacuum pump 19 for evacuating the inside of the reaction chamber 10. Further, a coil antenna 20 for generating plasma within the reaction chamber 10 is provided above the dielectric window 16.

The coil antenna 20 is connected with a power source (not shown) for supplying radio frequency (RF) current. As the RF current flows in the coil antenna 20, a magnetic field is produced around the coil antenna 20, and in accordance with variation of the magnetic field as a function of time, an electric field is induced within the reaction chamber 10. At the same time, the reaction gas is supplied into the reaction chamber 10 through the gas distribution ports 15, and is ionized by collisions with electrons accelerated by the induced electric field to generate plasma within the reaction chamber 10. The generated plasma chemically reacts with the surface of the wafer W so that the wafer W is subject to a desired process, e.g., etching. Meanwhile, an additional RF power source (not shown) is generally connected to the electrostatic chuck 12 for supplying a bias voltage to increase the energy of ions derived from the plasma and collided with the wafer W.

Figure 2:
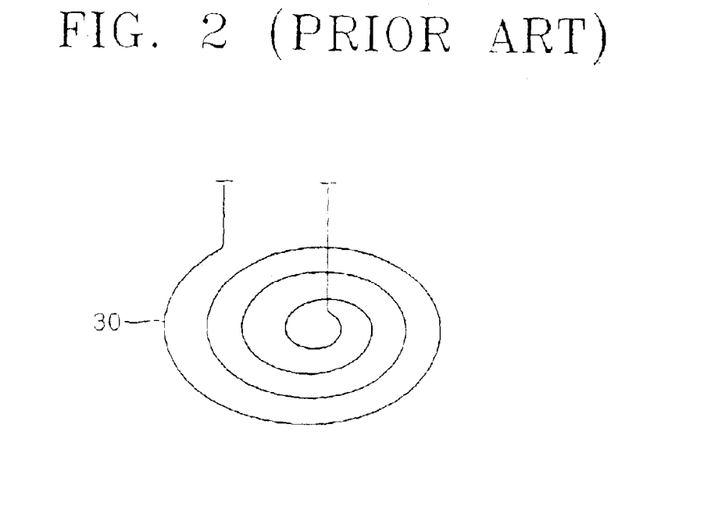
FIG. 2 shows an example of a conventional spiral coil antenna.
Figure 3A:
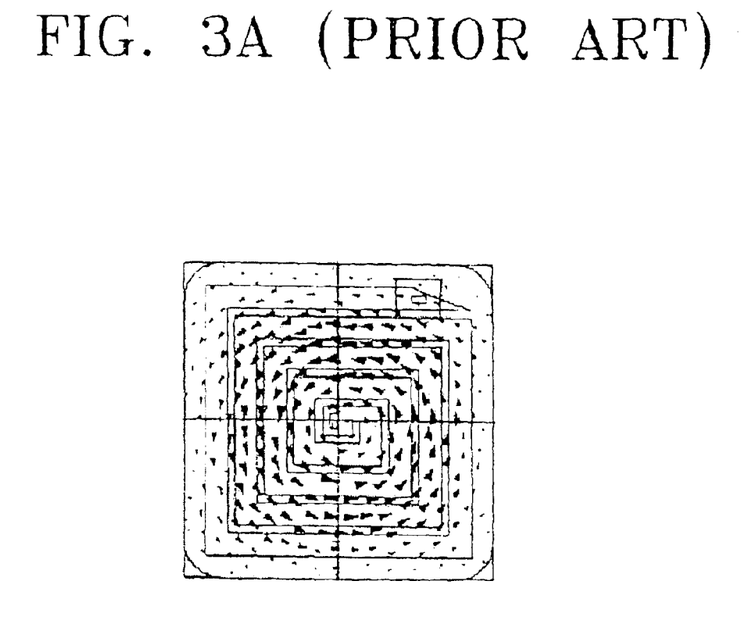
FIGS. 3A and 3B show electric field distribution and density of plasma generated within the reaction chamber by the spiral coil antenna shown in FIG. 2, respectively.
Figure 3B:
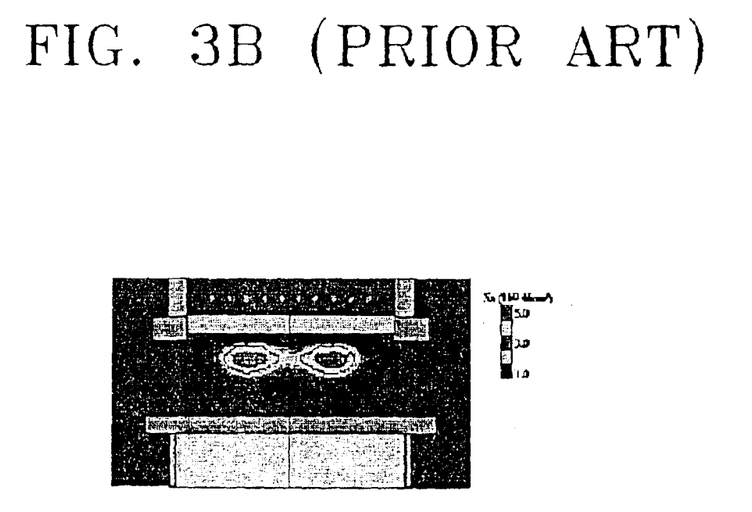

FIG. 2 shows an example of a conventional spiral coil antenna, and FIGS. 3A and 3B show electric field distribution and density of plasma generated within the reaction chamber shown in FIG. 1 by the spiral coil antenna shown in FIG. 2, respectively. As shown in FIG. 2, the spiral coil antenna 30 is typically comprised of a single spirally wound conductive coil. However, the spiral coil antenna 30 has a disadvantage in that the magnitude of the electric field induced thereby is not uniform. That is, as shown in FIG. 3a, the electric field is relatively weak at the edge portion of the spiral coil antenna, and is strong at the center portion thereof. Therefore, the density of the plasma generated is highest at the center portion of the reaction chamber.

The most densely generated plasma at the center portion of the reaction chamber is diffused toward a wafer placed near the bottom of the reaction chamber. Consequently, the density of the plasma in an area near the wafer surface where reaction between the plasma and the wafer occurs is high at the center portion of the area near the wafer surface, and is low at the edge portions of the area near the wafer surface. Such irregular distribution of the plasma density causes a problem of the depth to which the wafer or substrate is etched or the thickness to which a material is deposited on the wafer or substrate being non-uniform over the surface thereof. As the diameter of the reaction chamber is increased to accommodate larger wafers, this non-uniformity problem becomes more serious. Further, in order to keep the plasma density sufficiently high within the reaction chamber, the radius of the antenna 30 and the number of turns of the coil should be increased to conform to the increased size of the ICP equipment. However, increasing the number of turns of the coil causes another problem in that the self-inductance of the antenna increases, and accordingly, the efficiency of the plasma discharges is degraded.

Figure 4A:
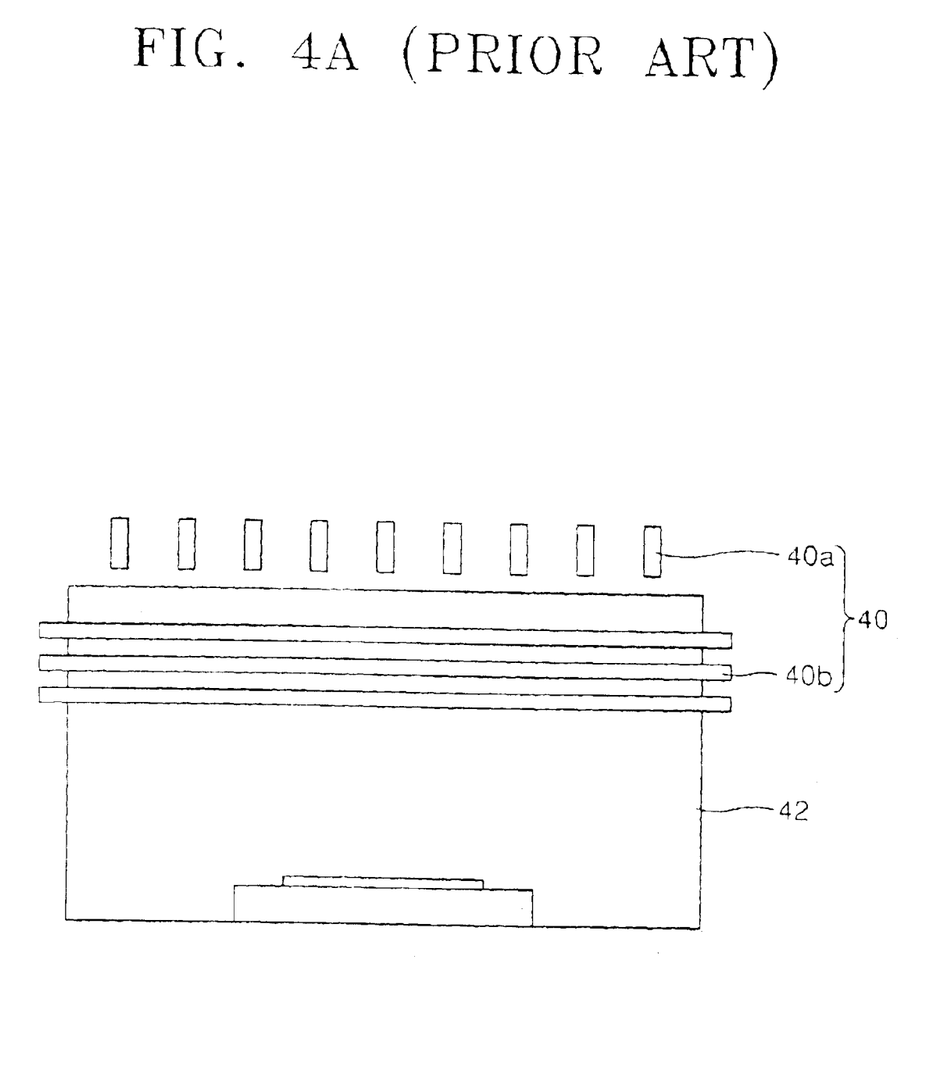
FIGS. 4A through 4C show other examples of conventional coil antennas.
Figure 4B:
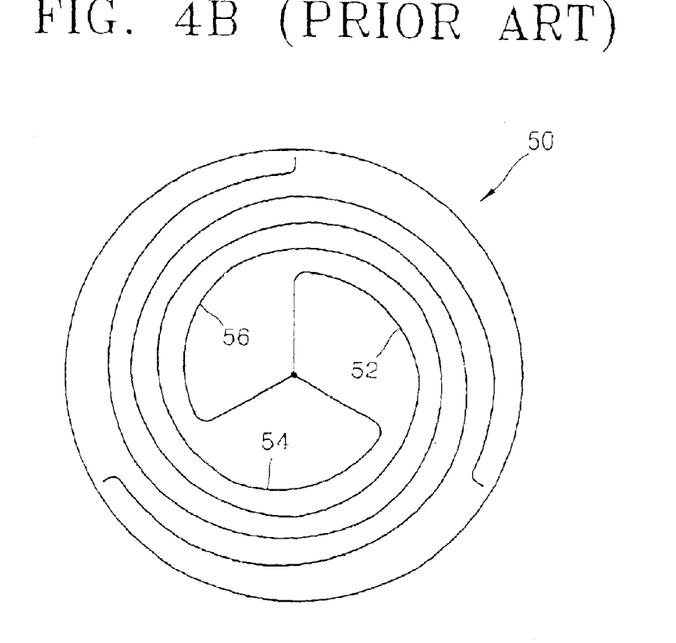
Figure 4C:
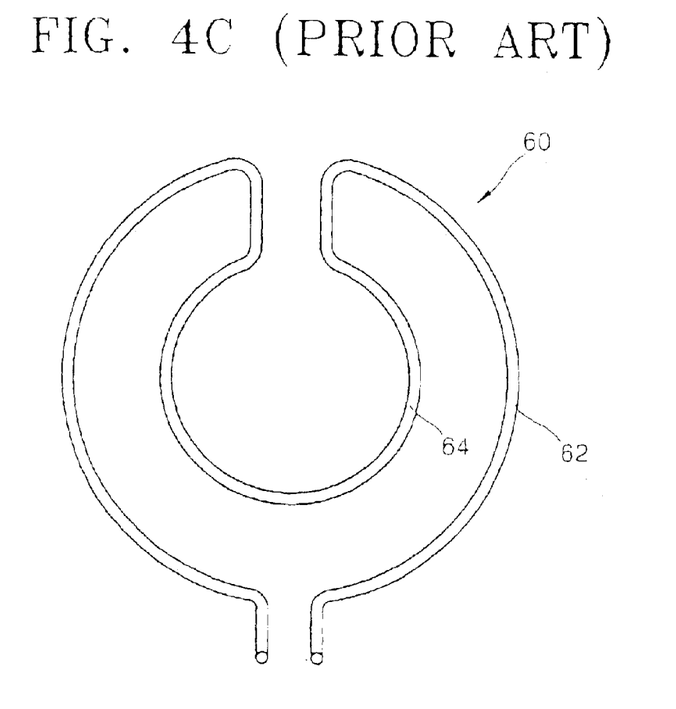

FIGS. 4A through 4C show various antennas that have been proposed to solve the above-described problems of coil antennas. FIG. 4A shows an antenna 40 disclosed in U.S. Pat. No. 5,401,350, which includes a spiral coil antenna 40a placed on the upper portion of a reaction chamber 42, and an additional solenoid-type antenna 40b wound around the outer surfaces of the sidewalls of the reaction chamber 42. The antenna 40 shown in FIG. 4A compensates for the low plasma density at the edge portions of the reaction chamber 42 to solve the problem of the non-uniform plasma density distribution that is encountered with the conventional spiral coil antenna described above. However, since the additional antenna 40b is wound around the outer surfaces of the sidewalls of the reaction chamber 42, the portions of the reaction chamber 42 corresponding to the antenna 40b should be made of a dielectric substance. Further, an additional coolant passage should be provided for cooling the antenna 40b. Therefore, the antenna as shown in FIG. 4A has a problem in that the entire size of the apparatus increases.

FIG. 4B shows another antenna 50 disclosed in U.S. Pat. No. 6,291,793, which includes a plurality of spiral coils 52, 54, and 56 branching off in parallel. The multiple and parallel type antenna 50 shown in FIG. 4B has a merit in that the self-inductance of the antenna 50 can be lowered as the number of branching off coils 52, 54, and 56 increases. However, such multiple and parallel type antenna has disadvantages in that the density of the plasma generated at the center portion of the antenna 50 is low, and parameters for controlling the uniformity of the plasma density distribution are limited.

FIG. 4C shows another antenna 60 disclosed in U.S. Pat. No. 6,080,271, wherein current flows in adjacent coils 62 and 64 in opposite directions. In the case of the conventional spiral coil antenna wherein current flows in each coil in the same direction, the magnetic fields produced around the adjacent coils are counterbalanced. However, in the case of the antenna 60 shown in FIG. 4C, the magnetic fields generated around the adjacent coils 62 and 64 reinforce each other. Accordingly, the antenna 60 of FIG. 4C has an advantage in that the inductance of the antenna is lowered. However, since the intensity of the inductive electric field is decreased, and therefore, the plasma density is lowered, there is a problem in that a magnetic core should be used to compensate for the reduced intensity of the electric field.

Due to the problems described above, the conventional antennas disclosed so far have shortcomings in adequately conforming to variations in process conditions to obtain high plasma uniformity. Particularly, as wafers become larger, it is more difficult to maintain uniform plasma density near the edge portions of the wafers using the conventional antennas, and as a result, the quality and yield of semiconductor devices are seriously deteriorated.

SUMMARY OF THE INVENTION

The present invention provides an inductively coupled plasma generating apparatus incorporating a double-layered antenna system with lower and upper coil antennas to improve uniformity of plasma density around a substrate within a reaction chamber.

An inductively coupled plasma generating apparatus according to the present invention includes a reaction chamber having an inner space kept in a vacuum state; an antenna system installed at an upper portion of the reaction chamber to induce an electric field for ionizing reaction gas supplied into the reaction chamber and generating plasma; and an RF power source connected to the antenna system to supply RF power to the antenna system, wherein the antenna system includes a lower antenna installed in adjacent to the upper portion of the reaction chamber, and an upper antenna installed a predetermined distance above the lower antenna.

According to an embodiment of the present invention, it is preferable that the upper antenna is installed to correspond to edge portions of a substrate placed within the reaction chamber.

In such embodiment of the present invention, it is preferable that the upper antenna includes a single-wire circular coil having either one or two turns.

Further, it is preferable that the lower antenna includes either a spiral coil having a predetermined number of turns or a plurality of concentric, connected circular coils.

Furthermore, the lower and the upper antennas preferably are connected in parallel with a single power source. However, the lower and the upper antennas may have different RF power sources.

According to another embodiment of the present invention, it is preferable that the lower and the upper antennas respectively include an outside antenna placed to correspond to edge portions of a substrate within the reaction chamber, and an inside antenna placed inside the outside antenna with a predetermined space therebetween.

In such embodiment of the present invention, it is preferable that current flows opposite directions through the adjacent inside and outside antennas and in the same direction through the adjacent upper and lower antennas adjacent.

Further, two single-wire coils are placed to cross each other and extend up and down, and outside and inside so as to configure upper outside, lower outside, upper inside, and lower inside antennas.

Furthermore, the two single-wire coils are connected in parallel with a single power source. However, the two single-wire coils may have different RF power sources.

According to the present invention, the uniformity of the plasma density distribution around the substrate within the reaction chamber can be controlled by adjusting the positions of an upper or an inside antenna.

BRIEF DESCRIPTION OF THE DRAWINGS

The above and other objects and advantages of the present invention will become more apparent by describing, in detail, exemplary embodiments thereof with reference to the attached drawings in which.

DETAILED DESCRIPTION OF THE INVENTION

Exemplary embodiments of an inductively coupled plasma (ICP) generating apparatus according to the present invention will be described below with reference to FIGS. 5 through 9.

Figure 5:
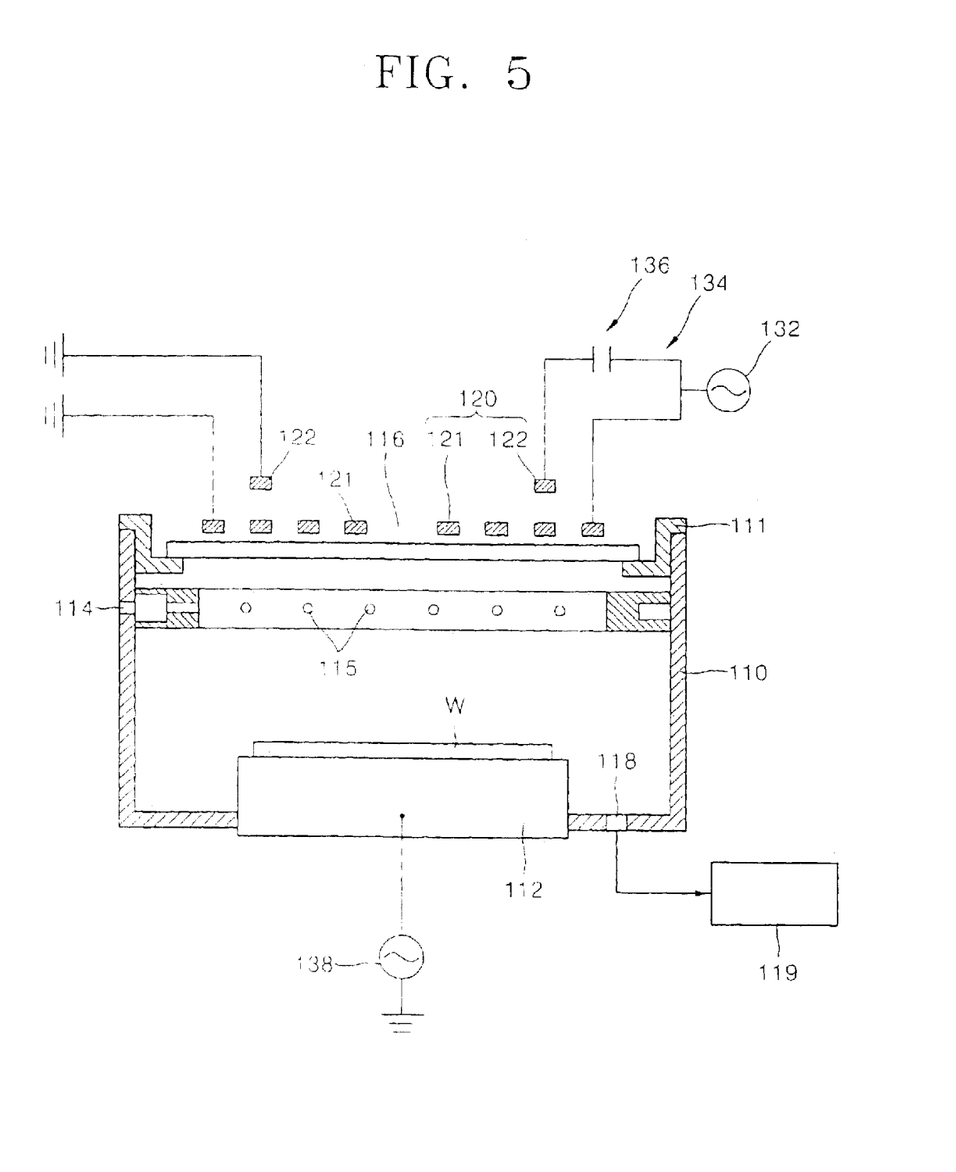
FIG. 5 shows an ICP generating apparatus incorporating a double-layered coil antenna according to an embodiment of the present invention.
Figure 6:
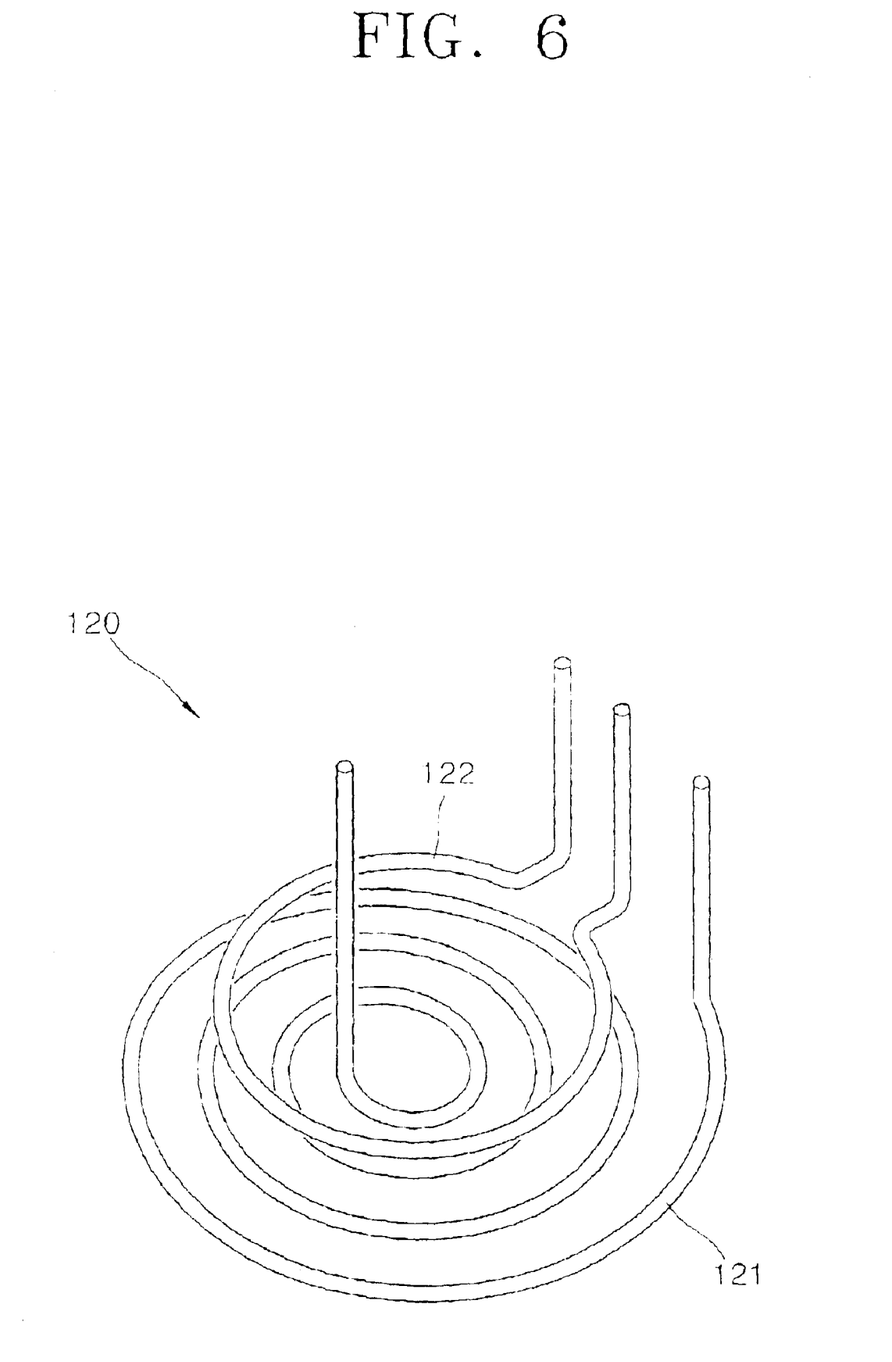
FIG. 6 is a perspective view of the double-layered coil antenna incorporated in the embodiment of FIG. 5.

FIG. 5 schematically shows the structure of an ICP generating apparatus incorporating a double-layered coil antenna according to an embodiment of the present invention, and FIG. 6 is a perspective view of the double-layered coil antenna shown in FIG. 5. The ICP generating apparatus shown in FIG. 5 is a semiconductor manufacturing apparatus for finely processing a substrate, i.e., a wafer W, e.g., etching or depositing a certain material on the waver W using plasma generated by the antenna system 120 shown in FIG. 6.

Referring to FIG. 5, the ICP generating apparatus includes a reaction chamber 110 for generating plasma. The inside of the reaction chamber 110 is kept in vacuum condition, and for that purpose, a vacuum suction port 118 is provided at the bottom of the reaction chamber 110 and connected to a vacuum pump 119. An electrostatic chuck 112 for supporting a substrate, e.g., a wafer W, is provided at a lower portion within the reaction chamber 110, and an RF power source 138 is connected to the electrostatic chuck 112 to apply a bias voltage to enabling ions of the plasma generated within the reaction chamber 110 to collide against the surface of the wafer W with sufficiently high energy. A dielectric window 116 is installed above the upper cover 111 of the reaction chamber 110 to transmit the RF power. A gas supply port 114 is formed at the sidewall of the reaction chamber 110 to supply reaction gas into the reaction chamber 110. A plurality of gas distribution ports 115 connected to the gas supply port 114 can be provided within the reaction chamber 110.

An antenna system 120 is provided on the top of the reaction chamber 110, i.e., above the dielectric window 116. The antenna system 120 induces an electric field to generate plasma by ionizing reaction gas supplied into the reaction chamber 110. At least one RF power source 132 is connected to the antenna 120 to supply RF power thereto. As RF current flows in coils forming the antenna system 120, a magnetic field is produced according to Ampere's right-hand rule. And, as the magnetic field varies as a function of time, an electric field is induced within the reaction chamber 120 according to Faraday's law of electromagnetic induction. The induced electric fields accelerate electrons, and the accelerated electrons ionize reaction gas supplied into the reaction chamber 110 through the gas distribution ports 115 to generate plasma.

Referring to FIG. 6, the antenna system 120 includes a lower antenna 121 placed in adjacent to the upper portion of the reaction chamber 110, and an upper antenna 122 placed a predetermined distance above the lower antenna 121. In other words, the antenna system 120 has a double-layered structure.

The lower antenna 121 can be made of a spiral coil with a number of turns, as shown in FIG. 6. Although not shown in the attached drawings, the lower antenna may be made of a plurality of circular coils concentrically arranged and connected with each other. Further, the lower antenna 121 may be made of various types of coils other than the spiral coil or the concentrically arranged circular coils. In addition, while the wire of the lower antenna 121 is shown in FIG. 6 to have a circular cross section, it may alternatively have a rectangular cross section as shown in FIG. 5. The lower antenna 121 radiates RF power to generate plasma within the reaction chamber 110.

Meanwhile, the upper antenna 122 can be made of a single-wire circular coil with only one turn, as shown in FIG. 6. Although not shown in the attached drawings, the upper antenna may alternatively have at least two turns. Further, while the wire of the upper antenna 122 is shown in FIG. 6 to have a circular cross section, it may alternatively have a rectangular cross section as shown in FIG. 5. The upper antenna 122 can be placed where needed in accordance with the size of the substrate, e.g., a wafer W placed within the reaction chamber 110. In general, the upper antenna 122 is placed where the density of plasma generated by the lower antenna is low, e.g., near edge portions of the wafer W. By placing the upper antenna 122 as described above, the plasma density around the edge portions of the wafer W can be increased, and therefore, the plasma density can be uniform across the entire wafer W.

As described above, according to the embodiment of the present invention, it is possible to control the plasma distribution by adjusting the placement of the upper antenna 122. Further, owing to the double-layered structure of the lower antenna 121 and the upper antenna 122, it is possible to achieve a uniform distribution of plasma without need of separate coolant passages or increasing the size of the apparatus.

Meanwhile, one end of each of the lower and upper antennas 121 and 122 can be connected to a single RF power source 132. The other ends of the lower and upper antennas 121 and 122 are grounded. However, the lower and upper antennas 121 and 122 may be connected to different RF sources, respectively, although not shown in the attached drawings. In the case of connecting the lower and upper antennas 121 and 122 to a single RF power source 132, it is desirable to connect both of the two antennas 121 and 122 in parallel with the RF power source 132 so that the inductance of each antenna can be reduced. When the inductance of the lower antenna 121 is $L_1$ and that of the upper antenna 122 is $L_2$, combined inductance $L_S$ for serially connected antennas 121 and 122 is represented by $L_S = L_1 + L_2$. However, if the antennas 121 and 122 are connected in parallel, the combined inductance $L_P$ is given by $1/L_P = 1/L_1 + 1/L_2$. Thus, connecting the antennas 121 and 122 in parallel reduces the inductance, and accordingly, increases radiation efficiency of the plasma.

In addition, it is desirable to install a capacitor 136 in a coupling circuit 134 for connecting the RF power source 132 to the lower and the upper antennas 121 and 122. In this case, there is an advantage in that it is possible to adjust a phase difference of RF currents flowing in the lower and the upper antennas 121 and 122.

Figure 7:
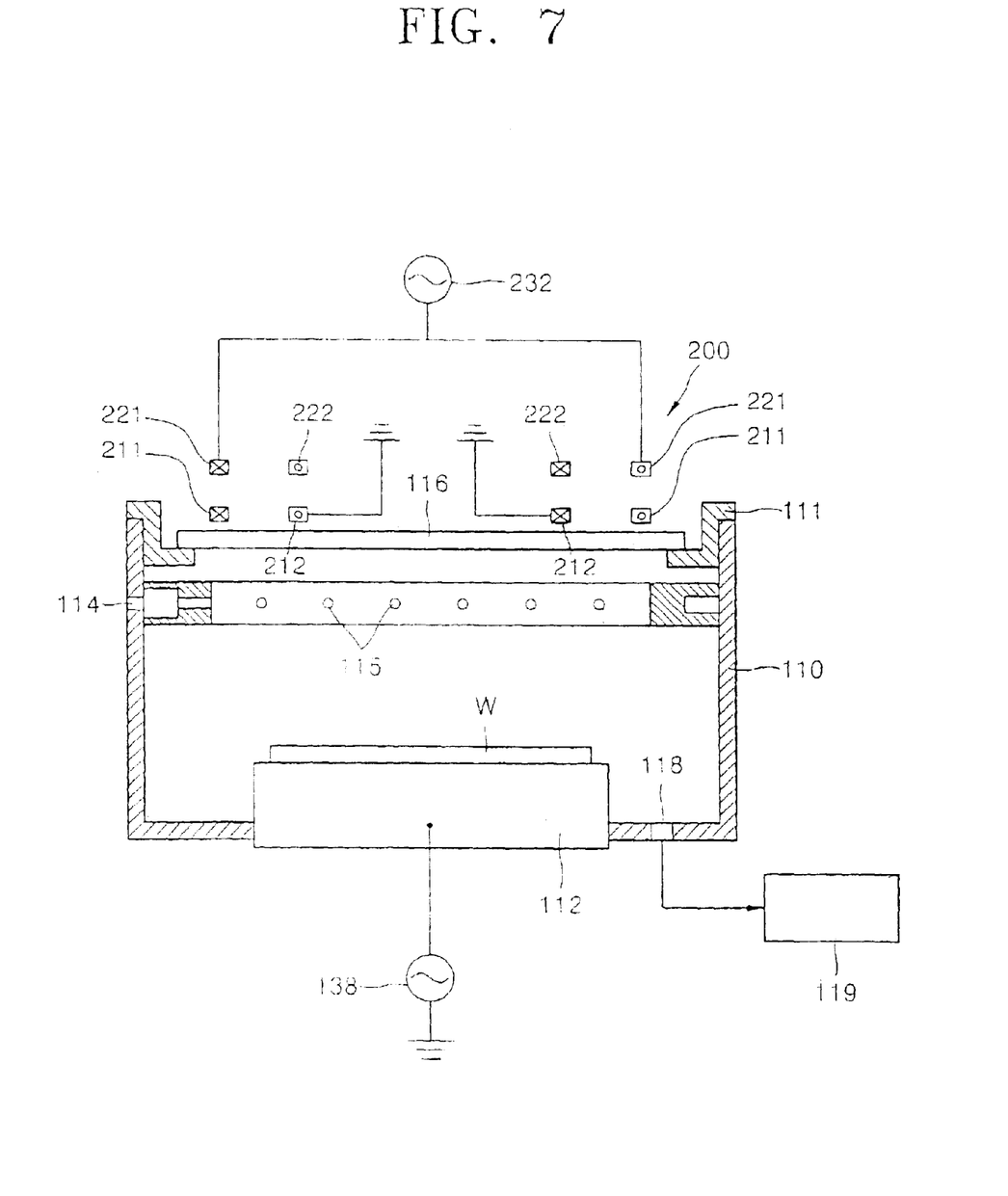
FIG. 7 shows an ICP generating apparatus incorporating a double-layered coil antenna according to another embodiment of the present invention.
Figure 8:
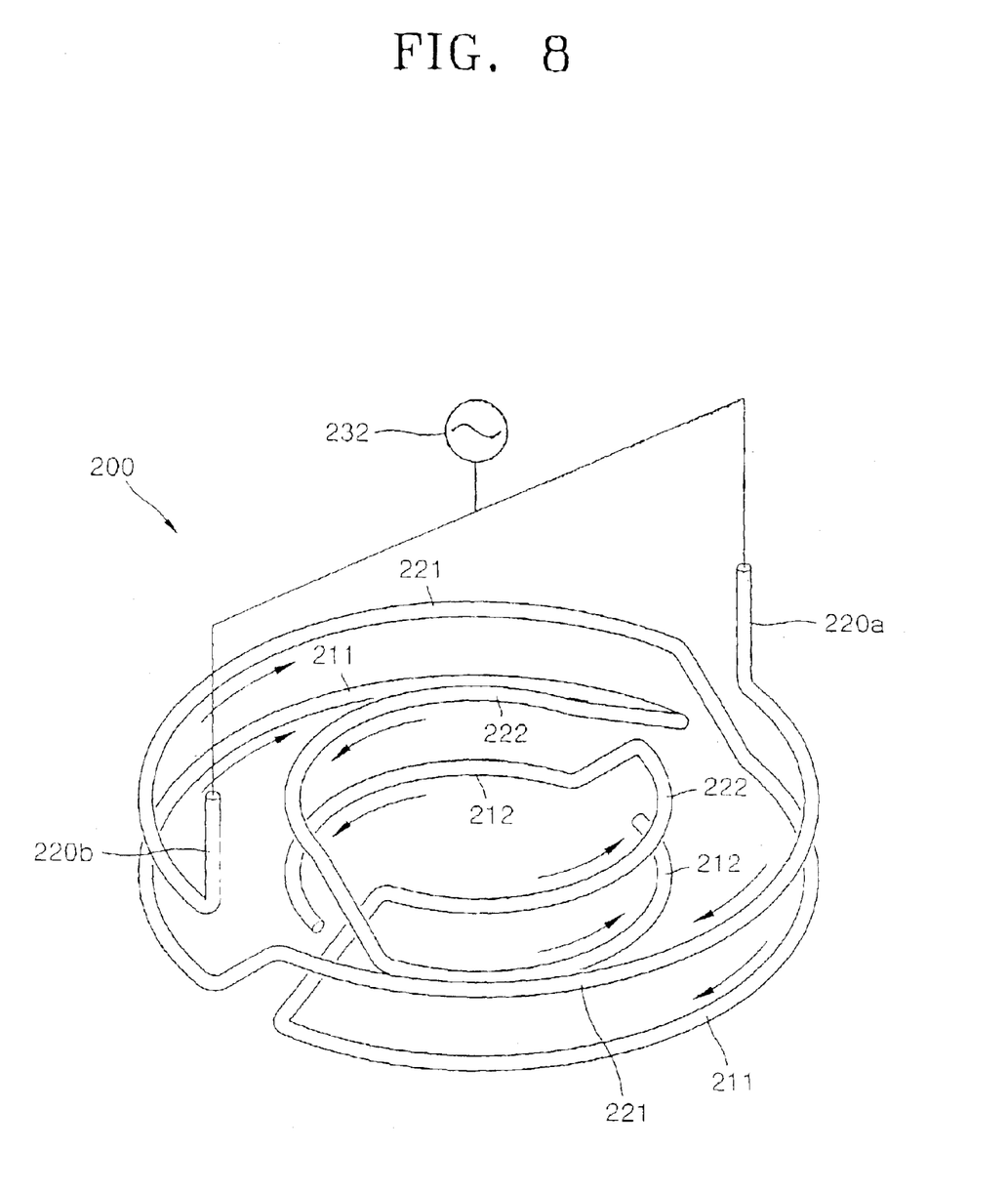
FIG. 8 is a perspective view of the double-layered coil antenna incorporated in the embodiment of FIG. 7.

FIG. 7 shows an ICP generating apparatus incorporating a double-layered coil antenna according to another embodiment of the present invention, and FIG. 8 is a perspective view of the double-layered coil antenna shown in FIG. 7. In FIG. 7, reference numerals identical to those of FIG. 5 denote identical elements, and detailed descriptions of such identical elements will not be repeated.

Referring to FIGS. 7 and 8, the antenna system 200 incorporated in another embodiment of the present invention includes lower antennas 211 and 212 placed adjacent to an upper portion of a reaction chamber 110, and upper antennas 221 and 222 placed a predetermined distance above the lower antennas 211 and 212. In other words, the antenna system 200 also has a double-layered structure.

The lower antennas 211 and 212 are comprised of a lower outside antenna 211 placed to correspond to edge portions of a wafer W placed within the reaction chamber 110, and a lower inside antenna 212 placed inside of the lower outside antenna 211 with a predetermined gap therebetween. Like the lower antennas 211 and 212, the upper antennas 221 and 222 are comprised of an upper outside antenna 221 and an upper inside antenna 222.

In the above-described structure, it is desirable that currents flowing in the adjacent lower outside and lower inside antennas 211 and 212 are in opposite directions. Likewise, it is desirable that currents flowing in the adjacent upper outside and upper inside antennas 221 and 222 are in opposite directions. On the other hand, the directions of the currents flowing in the adjacent upper outside and lower outside antennas 221 and 211 may be the same, and the directions of the currents flowing in the adjacent upper inside and lower inside antennas 222 and 212 may also be the same.

The above-described structure can be made of two single-wire coils 220a and 220b placed to cross each other and extend up and down, and outside and inside. One of the two single-wire coils 220a and 220b, i.e., a first coil 220a, has two turns, i.e., outside and inside turns. The outside turn of the first coil 220a forms a half of the upper outside antenna 221, and is bent downward to form a half of the lower outside antenna 211. The inside turn of the first coil 220a forms a half of the upper inside antenna 222, and is bent downward to form a half of the lower inside antenna 212. Here, the winding direction of the outside turn of the first coil 220 is opposite to that of the inside turn. Meanwhile, the other of the two single-wire coils 220a and 220b, i.e., a second coil 220b, is formed in the same way as described above. That is, the outside turn of the second coil 220b forms the remaining halves of the respective upper outside and lower outside antennas 221 and 211, and the inside turn forms the remaining halves of the respective upper inside and lower inside antennas 222 and 212. The first and the second coils 220a and 220b formed as described above are placed to overlap and cross each other. Then, the complete form of the antenna system 200 shown in FIG. 8 is obtained, and consequently, currents can flow in the respective portions of the antenna system 200 as described above. Arrows in FIG. 8 indicate the directions of the currents. Meanwhile, although the wires forming first and the second coils 220a and 220n are shown in FIG. 8 to have circular cross sections, they may alternatively have rectangular cross sections as shown in FIG. 7.

While one end of each of the two single-wire coils 220a and 220b can be connected with different RF power sources, it is desirable that both of the coils 220a and 220b are connected in parallel to a single RF power source 232. The other ends of the two single-wire coils 220a and 220b are grounded. As described above, parallel connection of the two single-wire coils 220a and 220b reduces inductance.

As described above, according to the second exemplary embodiment of the present invention, the two single-wire coils 220a and 220b are placed to cross each other so that the currents flow in opposite directions through the outside antennas 211, 221 and the inside antennas 212, 222. Moreover, the lower antennas 211, 212 and the upper antennas 221, 222 are connected in parallel. Accordingly, the self-inductance of the antennas can be reduced. Further, due to cross coupling effects between the lower antennas 211, 212 and the upper antennas 221, 222, the induced electric field can be reinforced. In addition, owing to the double-layered structure of the lower antennas 211, 212 and the upper antennas 221, 222, it is possible to achieve a uniformity distribution of plasma without need of separate coolant passages or increasing the size of the apparatus.

Figure 9:
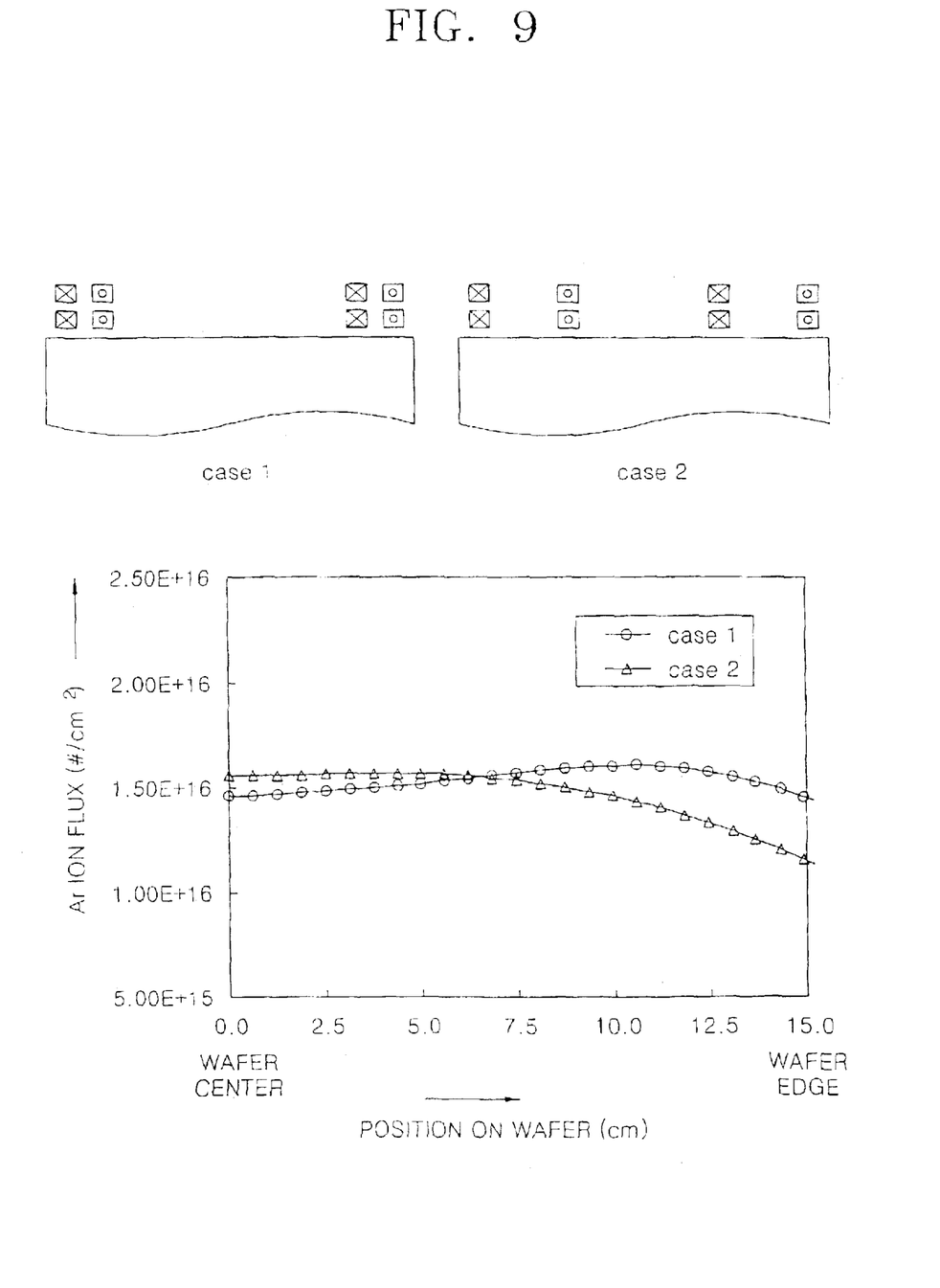
FIG. 9 is a graph of plasma flux versus distance from the center of a wafer for two cases with different distances between inside and outside antennas.

FIG. 9 is a graph of plasma flux within a reaction chamber versus distance from the center of a wafer W for two cases with different distances between inside and outside antennas. The data on the graph is argon (Ar) ion flux simulation data. In case 1, the distance between the inside and the outside antennas is narrow, and in case 2, the distance between the inside and the outside antennas is wide.

As shown in FIG. 9, compared to case 2 in which the inside antenna is placed close to the center portion of the wafer, case 1 in which the inside antenna is placed close to the edge portions of the reaction chamber indicates slightly lower plasma density around the center portion of the wafer and significantly higher plasma density around the edge portions of the wafer. That is, the plasma density around the wafer can be controlled to be uniform by adjusting the distance between the outside and the inside antennas.

As described above, according to the second exemplary embodiment of the present invention, it is possible to obtain uniform plasma density across the entire wafer by adjusting the distance between the outside and the inside antennas, and particularly, by adjusting the position of the inside antenna in accordance with the size of the wafer.

As can be understood from the above description, the inductively coupled plasma (ICP) generating apparatus incorporating a double-layered coil antenna according the present invention has the following features.

First, it is possible to control the plasma density to be uniform across the wafer by adjusting the position of the upper or the inside antenna in accordance with the size of the wafer. That is, it is possible to obtain a uniform distribution of plasma around not only the center portion but also the edge portions, even when the wafer or substrate is large, and therefore, the quality or yield of semiconductor devices can be improved. Further, owing to the double-layered structure of the lower antenna and the upper antenna, it is possible to achieve uniformity of plasma density without need of separate coolant passages or increasing the size of the apparatus.

Second, it is possible to efficiently reduce self-inductance of the antenna by making current flow in opposite directions through the adjacent inside and outside antennas, and connecting the lower and upper antennas in parallel. Further, owing to coupling effects of the double-layered antennas, the induced electric field can be reinforced. Accordingly, as the RF power radiation efficiency of the antenna system increases, it is possible to efficiently generate high density plasma.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. An inductively coupled plasma (ICP) generating apparatus, comprising:
    an evacuated reaction chamber;
    an antenna system disposed above the reaction chamber to induce an electric field for ionizing reaction gas supplied into the reaction chamber and generating plasma, wherein the antenna system is disposed above the generated plasma; and
    an RF power source connected to the antenna system to supply RF power to the antenna system, wherein the antenna system comprises a lower antenna disposed adjacent to an uppermost portion of the reaction chamber, and an upper antenna disposed a predetermined distance above the lower antenna.

2. The ICP generating apparatus according to claim 1, wherein the upper antenna is disposed to correspond to edge portions of a substrate placed within the reaction chamber.

3. The ICP generating apparatus according to claim 1, wherein the upper antenna includes a single-wire circular coil with one turn.

4. The ICP generating apparatus according to claim 1, wherein the upper antenna includes a single-wire circular coil with at least two turns.

5. The ICP generating apparatus according to claim 1, wherein the lower and the upper antennas are connected to a single power source.

6. The ICP generating apparatus according to claim 5, wherein the lower and the upper antennas are connected in parallel to the single power source.

7. The ICP generating apparatus according to claim 5, wherein a capacitor is provided in a coupling circuit for connecting the RF power source and the lower and the upper antennas.

8. The ICP generating apparatus according to claim 1, wherein the lower and the upper antennas are each connected to a different RF power source.

9. The ICP generating apparatus according to claim 1, wherein the lower antenna includes a spiral coil with several turns.

10. The ICP generating apparatus according to claim 1, wherein the lower antenna includes a plurality of concentric, connected circular coils.

11. The ICP generating apparatus according to claim 1, wherein the lower and the upper antennas respectively include an outside antenna placed to correspond to edge portions of the substrate within the reaction chamber, and an inside antenna placed inside the outside antenna with a predetermined space therebetween.

12. The ICP generating apparatus according to claim 11, wherein current flows in opposite directions through the adjacent inside and outside antennas.

13. The ICP generating apparatus according to claim 11, wherein current flows in the same direction through the adjacent upper and lower antennas.

14. The ICP generating apparatus according to claim 11, wherein two single-wire coils are placed to cross each other and extend up and down and outside and inside so as to configure upper outside, lower outside, upper inside, and lower inside antennas.

15. The ICP generating apparatus according to claim 14, wherein the two single-wire coils respectively include an outside turn and an inside turn and the outside turn constitutes half of the respective upper outside and the lower outside antennas while the inside turn constitutes the other half of the respective upper inside and the lower inside antennas.

16. The ICP generating apparatus according to claim 15, wherein the outside turn and the inside turn are wound in opposite directions.

17. The ICP generating apparatus according to claim 14, wherein the two single-wire coils are connected in parallel to a single power source.

18. The ICP generating apparatus according to claim 14, wherein the two single-wire coils are each connected to a different RF power source.

19. An inductively coupled plasma (ICP) generating apparatus, comprising:

an evacuated reaction chamber;

an antenna system disposed at an upper portion of the reaction chamber to induce an electric field for ionizing reaction gas supplied into the reaction chamber and generating plasma; and an RF power source connected to the antenna system to supply RF power to the antenna system, wherein the antenna system comprises a lower antenna disposed adjacent to the upper portion of the reaction chamber, and an upper antenna disposed a predetermined distance above the lower antenna, wherein the lower and the upper antennas respectively comprise an outside antenna disposed to correspond to edge portions of the substrate within the reaction chamber, and an inside antenna disposed inside the outside antenna with a predetermined space therebetween, and wherein two single-wire coils are placed to cross each other and extend up and down and outside and inside so as to configure upper outside, lower outside, upper inside and lower inside antennas.

20. The ICP generating apparatus according to claim 19, wherein the two single-wire coils respectively include an outside turn and an inside turn and the outside turn constitutes half of the respective upper outside and the lower outside antennas while the inside turn constitutes the other half of the respective upper inside and the lower inside antennas.

21. The ICP generating apparatus according to claim 20, wherein the outside turn and the inside turn are wound in opposite directions.

* * * * *